United States Patent
Eikenbroek

(10) Patent No.: US 7,391,840 B2
(45) Date of Patent: Jun. 24, 2008

(54) PHASE LOCKED LOOP CIRCUIT, ELECTRONIC DEVICE INCLUDING A PHASE LOCKED LOOP CIRCUIT AND METHOD FOR GENERATING A PERIODIC SIGNAL

(75) Inventor: Johannes Wilhelmus Theodorus Eikenbroek, Emmen (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 204 days.

(21) Appl. No.: 10/517,181

(22) PCT Filed: Jul. 3, 2002

(86) PCT No.: PCT/NL02/00436

§ 371 (c)(1),
(2), (4) Date: Dec. 7, 2004

(87) PCT Pub. No.: WO2004/006437

PCT Pub. Date: Jan. 15, 2004

(65) Prior Publication Data

US 2006/0165206 A1    Jul. 27, 2006

(51) Int. Cl.
*H03K 11/00* (2006.01)
*H04L 25/49* (2006.01)
*H03D 3/18* (2006.01)
*H03D 3/24* (2006.01)
*H03B 5/20* (2006.01)
*H04B 1/06* (2006.01)
*H04B 7/00* (2006.01)

(52) U.S. Cl. .............. 375/376; 375/215; 375/294; 375/327; 375/331; 375/373; 331/135; 331/136; 455/258; 455/259; 455/260

(58) Field of Classification Search .......... 375/215, 375/294, 327, 376, 331, 329, 373, 374, 375; 322/126, 127, 128; 455/258, 259, 260
See application file for complete search history.

(56) References Cited

U.S. PATENT DOCUMENTS

| 5,550,515 A | * | 8/1996 | Liang et al. ............... 331/11 |
| 6,008,703 A | * | 12/1999 | Perrott et al. ............. 332/100 |
| 6,011,815 A | * | 1/2000 | Eriksson et al. ........... 375/296 |
| 6,018,275 A | * | 1/2000 | Perrett et al. ............. 332/127 |
| 6,032,277 A | * | 2/2000 | Okumura .................. 714/724 |
| 2003/0058055 A1 | * | 3/2003 | Sridharan ................ 331/100 |

FOREIGN PATENT DOCUMENTS

WO    WO 9531861 A    11/1995

OTHER PUBLICATIONS

Beards R D. et al., "An Oversampling Delta-Sigma Frequency Discriminator" IEEE Transactions on Circuits and Systems II: Analog and Digital Signal Processing, IEEE Inc., New York, US, vol. 41, No. 1, 1994, pp. 26-32, XP000439300 ISSN: 1057-7130.

* cited by examiner

*Primary Examiner*—Marsha D. Banks-Harold
*Assistant Examiner*—Chikaodili E Anyikire
(74) *Attorney, Agent, or Firm*—Michael Cameron

(57) ABSTRACT

A phase locked loop (PLL) circuit (1) comprising a loop input (11); a phase detector section (2) for detecting a phase difference between an input signal and a reference signal. The phase detector section (2) has a detector input connected to the loop input, a reference input and a detector output for outputting a signal related to the phase difference. A controlled oscillator (4) is connected with an input to the detector output and an oscillator output is connected to a loop output (12). The PLL has a feedback circuit which connects the oscillator output to the reference input, wherein the feedback circuit includes a device (7;71-74) having a transfer function with at least one zero.

3 Claims, 6 Drawing Sheets

PHASE LOCKED LOOP CIRCUIT, ELECTRONIC DEVICE INCLUDING A PHASE LOCKED LOOP CIRCUIT AND METHOD FOR GENERATING A PERIODIC SIGNAL

The invention relates to a phase locked loop circuit (PLL), electronic devices including such a circuit and a method for generating a periodic signal.

PLLs are generally known in the art. In general, a PLL comprises a phase detector for detecting a phase difference between an input signal and a reference signal. An output of the phase detector is connected to a voltage controlled oscillator (VCO) which provides an output signal having a frequency which is dependent on the voltage of the signal provided at the input of the VCO. Often, a (loop-)filter section is provided between the phase detector and the VCO. The VCO is connected to a feedback circuit. The output of this feedback circuit provides the reference signal which is compared by the phase detector to the input signal. Usually, the feedback circuit comprises a frequency divider in order to convert the frequency of the reference signal to the frequency of the PLL input signal.

For PLLs, it is usually required that after a frequency-step is applied to the input the frequency-error becomes zero. A frequency-step at the input of the PLL corresponds to a ramp in phase at the input of the phase-detector, because the phase-detector of the PLL compares the phase difference between the reference signal and the input signal. In order to arrive at a zero phase-error after settling of the PLL, two integrators are required in the loop, as is clear from basic control-theory. One of the integrators is inherently present in the voltage controlled oscillator (VCO) of the PLL, while the other integrator is usually implemented by the combination of a current-output of the phase-detector and a capacitor in the loop-filter. These integrators can be represented by two poles at the origin of the complex "s"-plane (where "s" is the well-known Laplace-operator).

However, these integrators may cause instability of the PLL, for example when the root locus of the PLL has positive real components. That is, for some value of the gain of the PLL, the poles of the circuit may come in the right-half of the s-plane, resulting in an instable system. It is known from U.S. Pat. No. 5,504,459 to provide a PLL with a zero in the transfer function, to prevent the PLL from becoming unstable. In this publication, the zero is realised by a resistor connected in series to a capacitor in the loop-filter of the PLL.

A disadvantage of such a zero is that the out-of-band attenuation of the PLL is decreased because if the closed-loop transfer inside the PLL frequency band is of the order K and the closed-loop transfer contains a zero, the order of the PLL outside the PLL frequency band will be K−1. Hence, the attenuation outside the frequency band of the PLL will be proportional to $\omega^{K-1}$, while for a system without zero the attenuation will be proportional to $\omega^K$, ω being the frequency. Not only the out-of-band attenuation is decreased, but the presence of the zero introduces an overshoot in the frequency step-response when a frequency-step is applied to the input of the PLL. In practice, this overshoot requires more voltage headroom at the output of the phase-detector. Moreover, the settling-time is increased compared to a system without the zero but with the same bandwidth.

It is a goal of the invention to provide a PLL with a better attenuation of signal components having a frequency outside the frequency band of the PLL.

The attenuation of the PLL is increased because the feedback path comprises a zero. The presence of a zero in the feedback-path, causes the zero to be invisible in the closed-loop transfer. Since the zero is not present in the closed-loop transfer, the out of band attenuation is increased because the gain fall-of is increased. For example, if in a PLL according to the invention the closed-loop transfer inside the PLL frequency band is of the order K, the attenuation outside the frequency band of the PLL will be proportional to $\omega^K$, while for a system with a zero present in the closed-loop transfer the attenuation will be proportional to $\omega^{K-1}$, ω being the frequency.

Further details, aspects and embodiments of the invention will be described with reference to the figures in the attached drawing.

The following terminology is used: the transfer function H(s) is the relationship between the input signal and the output signal of a device, seen in the Laplace-s domain, the transfer function is also referred to in literature as the system-function. For s=jω, j being the square root of −1 and ω the frequency of a signal, the system function is referred to as the frequency response. The forward-path transfer is the transfer through the forward path of a system. The loop gain of a feedback system is the transfer through the forward path and then back through the feedback loop. The closed loop transfer $H_{closed}$ of a system is the transfer of the system from the input to the output with the feedback present. The pole of a device, is the (complex) frequency for which the transfer function of a device approaches infinity. The zero of a device, is the (complex) frequency for which the transfer function of a device approaches zero.

Figure 1:
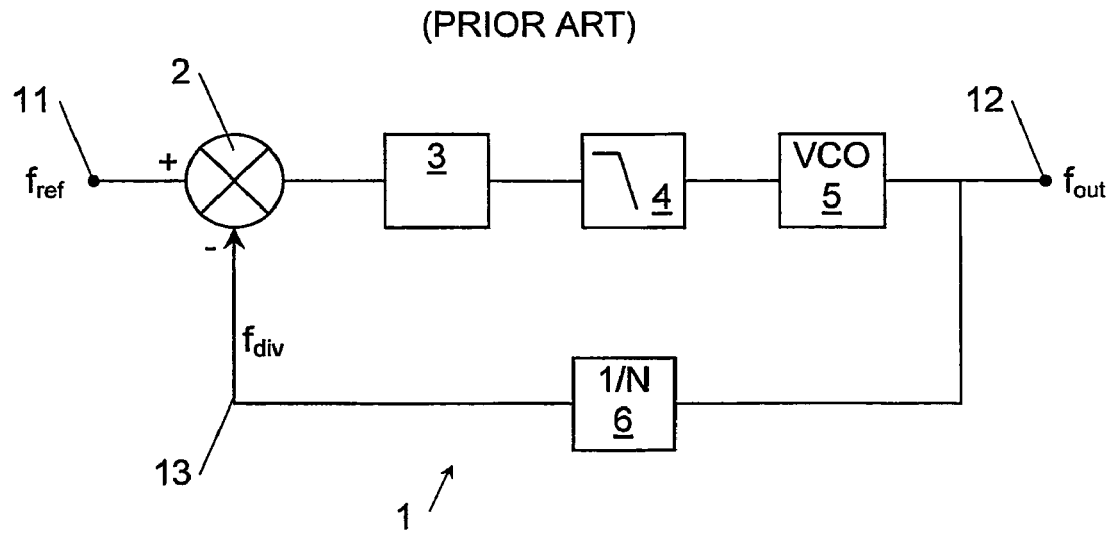
FIG. 1 shows a block diagram of an example of a phase locked loop as is known from the prior art.

FIG. 1 shows a general block diagram of a phase locked loop (PLL) 1, as is known from the prior art. The PLL 1 has a PLL input 11 and a PLL output 12. The PLL 1 includes a phase detector section comprising a combiner device 2 and a phase detector 3, a low-pass filter 4, a voltage controlled oscillator (VCO) 5 and a frequency divider 6. The PLL 1 forms a feedback system, with a feedback loop 13.

At the PLL input 11 an input signal of an input frequency ($f_{in}$) may be presented. In that case, the PLL provides a VCO signal of output frequency ($f_{out}$) at the PLL output 12. The VCO signal is generated by the VCO 5 based on a VCO input signal voltage. If the PLL 1 is in lock, the phase of the VCO signal will be equal to the phase of the input signal multiplied with a division factor N. Hence, the output frequency $f_{out}$ equals the input frequency $f_{in}$ multiplied with the division factor:

$$f_{out} = N \cdot f_{in}$$

The VCO output signal frequency $f_{out}$ is divided by the frequency divider 6 by the division ratio N. This results in a signal of a divided frequency or reference frequency $f_{div}$ which is equal to:

$$f_{div} = \frac{f_{out}}{N}$$

The signal with divided frequency $f_{div}$ is combined with the input signal of input frequency by combiner device 2, in this example by determining the difference between the input signal of input frequency and the signal of divided or reference frequency. The resulting output signal of the combiner device 2 is transmitted to phase detector 3. The phase detector 3 outputs a difference signal which is based on the difference in phase between the signal of divided frequency $f_{div}$ and the signal of input frequency $f_{in}$. The difference signal is low-pass filtered by filter 4 and used as the VCO input signal which controls the oscillation of the VCO 5. In a PLL, the filter section 3 and the frequency divider 6 may be omitted. However, most PLLs comprise a (loop-)filter and a frequency divider. Furthermore, the instead of a voltage controlled oscillator, a current controlled oscillator may be used.

Figure 2:
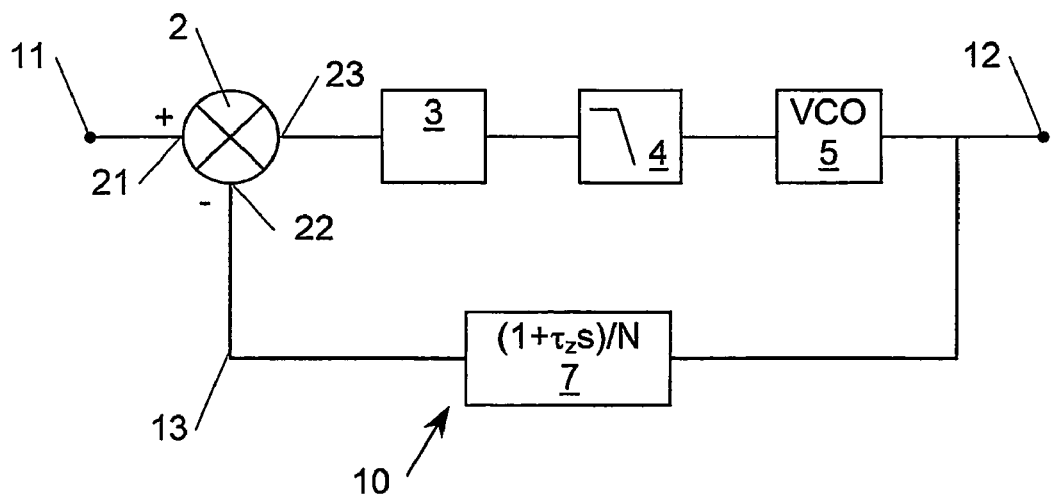
FIG. 2 shows a block diagram of a first example of an embodiment of a phase locked loop according to the invention.

FIG. 2 shows an example of a PLL 10 according to the invention. Like the prior art PLL 1 of FIG. 1, the PLL 10 has a PLL input 11, a PLL output 12, an combiner device 2, a phase detector 3, a low-pass filter 4 and a voltage controlled oscillator (VCO) 5. The PLL 10 also comprises a feedback loop 13. A combined zero and frequency divider device 7 is present in the feedback loop.

The zero and frequency divider device 7 has a transfer function G(s) with at least one zero. For example, the transfer function G(s) of the device 7 may be of the following type:

$$G(s) = \frac{1 + \tau_z s}{N} \quad (1)$$

In this equation s represents a complex frequency, N is the division ratio of the frequency divider and $\tau_z$ represents a time-constant of the zero. The device 7 thus has a zero at s equal to $-1/\tau_z$. The input signal of the device 7 is the PLL output signal $f_{out}$, while the output signal of the device 7 is the divided signal $f_{div}$. The closed loop transfer function $H_{closed}$ (s) of the PLL 10 is given by:

$$H_{closed} = \frac{H(s)}{1 + G(s)H(s)} \quad (2)$$

In this equation H(s) is the forward-path transfer function of the PLL, which is:

$$H(s) = K_D H_f(s) \frac{K_o}{s} \quad (3)$$

In this equation $K_D$ represents the transfer function of the phase detector 3, $H_f(s)$ represents the transfer function of the filter section 4 and $K_o/s$ represents the transfer function of the VCO 5. The closed loop transfer function of the PLL is thus equal to:

$$H_{closed} = \frac{K_D H_f(s) \frac{K_o}{s}}{1 + \left[\frac{1 + \tau_z s}{N}\right] K_D H_f(s) \frac{K_o}{s}} \quad (4)$$

In the PLL of FIG. 2, the zero device 7 is part of the feedback loop 13, i.e. the zero is integrated in the divider 5. As is seen in equation (4), the zero in the transfer function of the device 7 is not present as a zero in the closed loop transfer of the PLL. Such a zero is often called a phantom zero. Thereby, the zero provides a stable system, but does not decrease the out-of band attenuation.

Furthermore, the closed-loop bandwidth can be increased for a given rejection at a certain out-of-band spot-frequency compared to the system without the phantom-zero. Thereby, the settling-time after applying a frequency-step is improved, without affecting the out-of-band rejection performance for a certain out-of-band spot-frequency (and higher frequencies). For example, assume that the attenuation at an out-of-band frequency ω equal to $5/\tau_z$ is specified due to phase-noise requirements. If the original system (i.e. the system without the zero in the feedback loop) was a third order system with three equal closed-loop poles, the time constant of the system with the zero in the feedback loop can be made 2.5 times smaller to achieve this goal. The settling-time for a frequency-step is thus improved by a factor of approximately 2.5 compared to the prior art PLL. The improvement-factor will be even larger for out-of-band frequencies higher than $5/\tau_z$, because of the increased out-of band attenuation.

Alternatively, the order of the loop may be decreased by one and simultaneously the time-constant may be altered compared to a prior art PLL, while maintaining the same out-of-band rejection performance as compared to the original synthesiser. This gives an improvement in the settling-time by a factor of 2.2 when the standard third order system is replaced by a second order system with a zero in the feedback loop. (In which case it is found from simulations that the time constant of a PLL according to the invention may be made 0.58 times smaller compared to that of a prior art PLL).

In general, the avoidance of a zero in the closed-loop transfer and choosing real closed-loop poles reduces the overshoot in the step-response of the output-frequency. Hence, the VCO control-signal will have a smaller overshoot when a frequency-step is applied. This allows an increase in the allowable voltage swing of the VCO control-voltage for the same supply voltage. Alternatively, the required supply-voltage for a given swing may be decreased. Hence power consumption is reduced, since for a given swing a lower supply voltage may be used.

Further, in a PLL according to the invention, the peaking in the closed-loop phase-transfer is reduced compared to a PLL with a zero in the closed-loop transfer. This implies that no phase-noise amplification will take place at the band-edge.

Also, the bandwidth may be changed easily during switching by changing the frequency placement of the phantom-zero, optionally in combination with the phase-detector constant. This may for example be performed using a variable time-constant in the zero and/or in the phase-detector, for example using a variable resistor.

Also, due to the presence of the zero in the feedback loop, use of a phase-frequency detector is no longer required to obtain fast locking when large initial frequency-errors exist. A simple phase-detector may be used instead, whereby the complexity of the detector is reduced.

Figure 3:
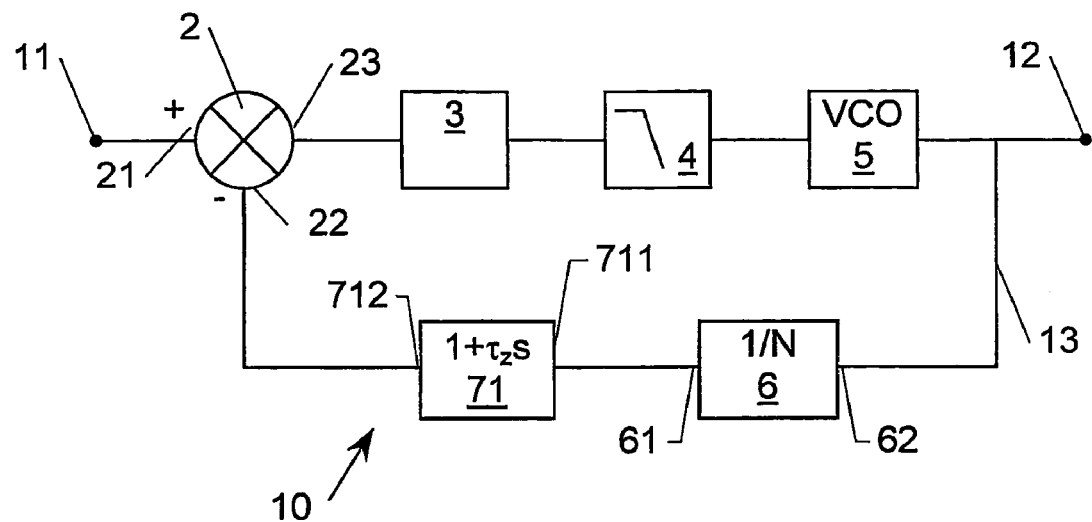
FIG. 3 shows a block diagram of a second example of an embodiment of a phase locked loop according to the invention.

In FIG. 2 the zero is implemented in a device which also performs the function of the frequency divider. The zero may also be implemented in a different way in the feedback loop. For example, the PLL of FIG. 3 has a feedback loop 13 with a frequency divider 6 and a separate zero device 71. The zero device 71 is connected with a zero input 711 to a divider output 62. The zero output 712 of the zero device is connected to a reference input 22 of the combiner device 2. An advantage of the implementation according to FIG. 3 is that the implementation of the zero is put in the loop where the lowest frequencies in the system are present. This makes the zero easy to implement and the power-consumption will be minimal.

Figure 4:
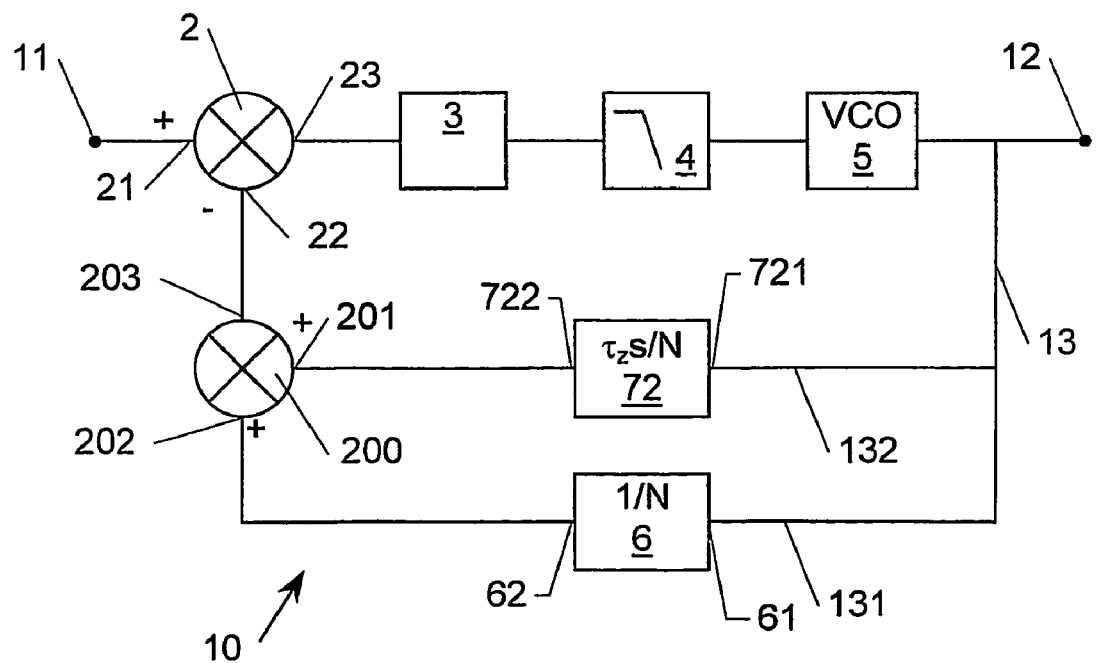
FIG. 4 shows a block diagram of a third example of an embodiment of a phase locked loop according to the invention.

The PLL in FIG. 4 has a feedback loop 13 with two paths 131,132. A first path 131 comprises a first frequency divider 72 with a transfer function equal $\tau_z s/N$. It should be noted that in a strict sense the divider 72 is an instantaneous phase differentiator, however from this point on, it is referred to as a frequency divider. A second path 132 comprises a second frequency divider device 6 with a transfer function of 1/N. The second divider 6 may thus be a conventional divider. The frequency dividers are both connected with their output 62 resp. 722 to an input 201,202 of a second combiner device 200. In this example, the second combiner device 200 is an adder device which adds the signals presented at the combiner inputs 201,202. The inputs 61 resp. 721 of the frequency divider devices 6,72 are connected to the output of the VCO 5. A second combiner output 203 of the second combiner device 200 is connected to the second input 22 of the combiner device 2. The combined transfer function of the feedback loop 13,131,132 is the combined transfer of the frequency divider devices 6,72 and thus equal to $(1+\tau_z s)/N$.

An advantage of the example of FIG. 4, is that it can be used in existing PLL's by inserting the zero in parallel with the already present feedback path. This already present feedback path usually contains the frequency divider of the PLL.

The example of a PLL 10 shown in FIG. 5, again comprises two feedback paths 131, 132. A first feedback loop 131 comprises a frequency divider 6 with a transfer function of 1/N. The frequency divider 6 may for example be a conventional frequency divider. A second feedback loop 132 comprises a combined phase detector and zero device 73 with a transfer function $K_{D}\tau_z s/N$, $K_D$ representing a phase detector transfer function. The output 32 of the phase detector and the output 732 of the zero device 73 are connected to the inputs 201 and 202 of a second combiner device 210. An output 203 of the second combiner device 200 is connected to the input 41 of the filter section 4. Preferably, the time-constant of the zero device 73 is set to be substantially equal to $K_D \tau_z/N$, however this is not essential.

Figure 5:
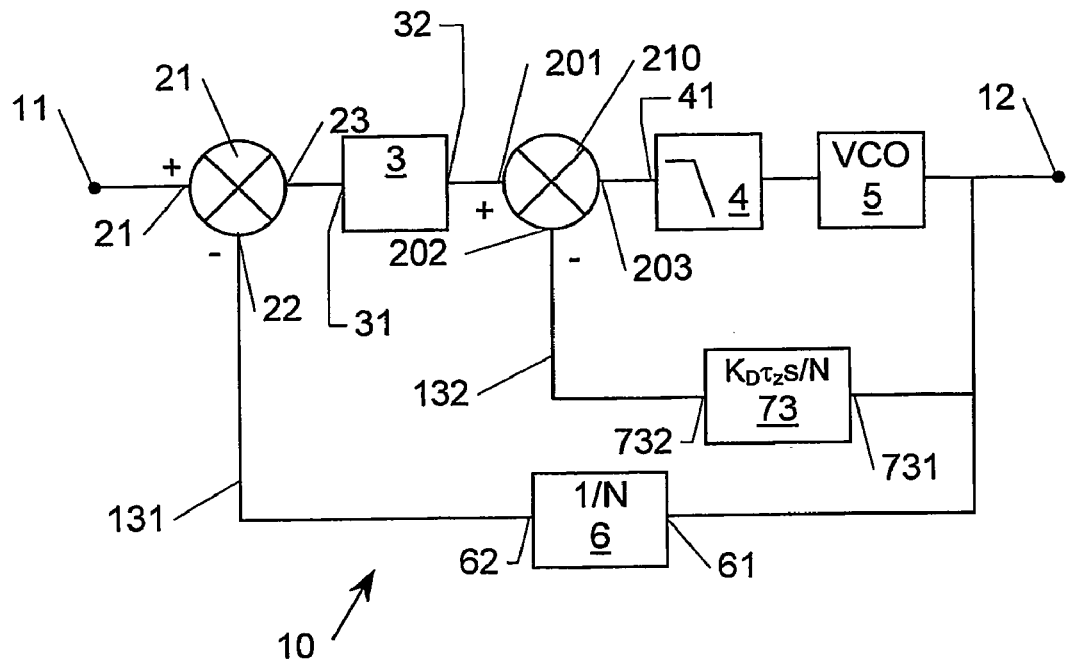
FIG. 5 shows a block diagram of a fourth example of an embodiment of a phase locked loop according to the invention.

An advantage of the example of a PLL according to the invention of FIG. 5, is that it can be very easy implemented in existing PLL's by inserting the zero between the output of the VCO and the output of the phase-detector.

Figure 6:
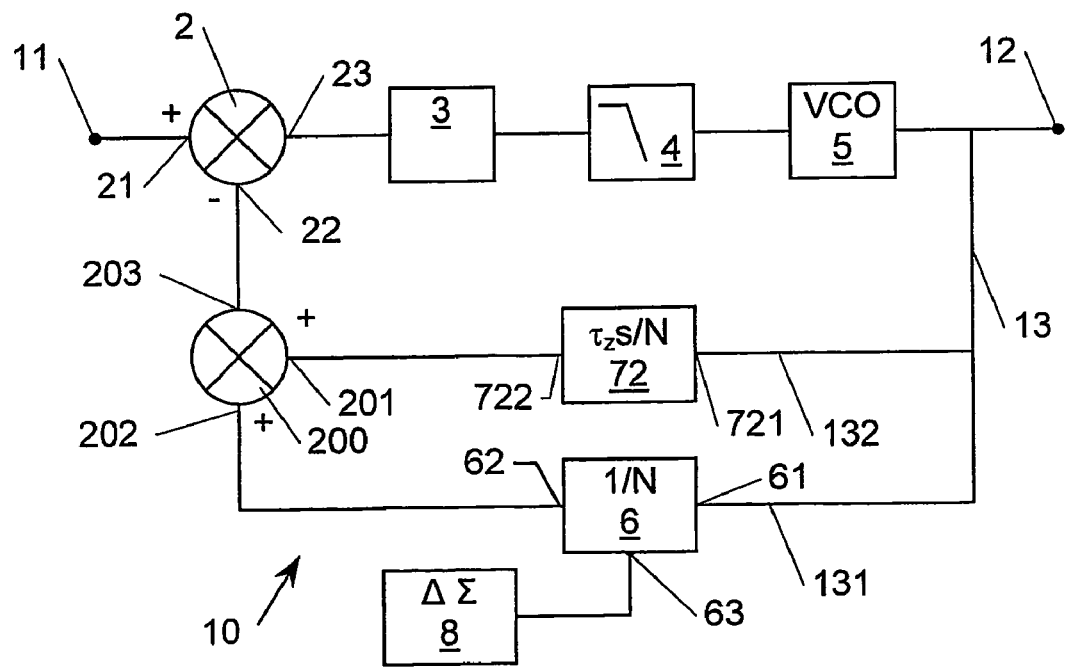
FIG. 6 shows a block diagram of a fifth example of an embodiment of a phase locked loop according to the invention.

The frequency divider in the feedback loop may be implemented as a fractional divider or a DeltaSigma-driven frequency divider. In that case, the output-signal of such a divider may be modelled as the sum of a signal with the wanted phase and a signal with an unwanted noisy phase. In the example shown in FIG. 6 of a PLL 10 according to the invention, a zero device 72 is placed between the output of the VCO and the input of the phase-detector. A delta-sigma modulator 8 is connected to a control input 63 of a frequency divider 62. The zero device 7 is connected with an input 721 to the PLL output 12. The output 722 of the zero device 7 is connected to a first input 201 of a second combiner device 200. A second input 202 of the combiner device 200 is connected to the output 62 of frequency divider 6. The combiner device 200 adds the signals presented at the inputs 201,202.

Figure 7:
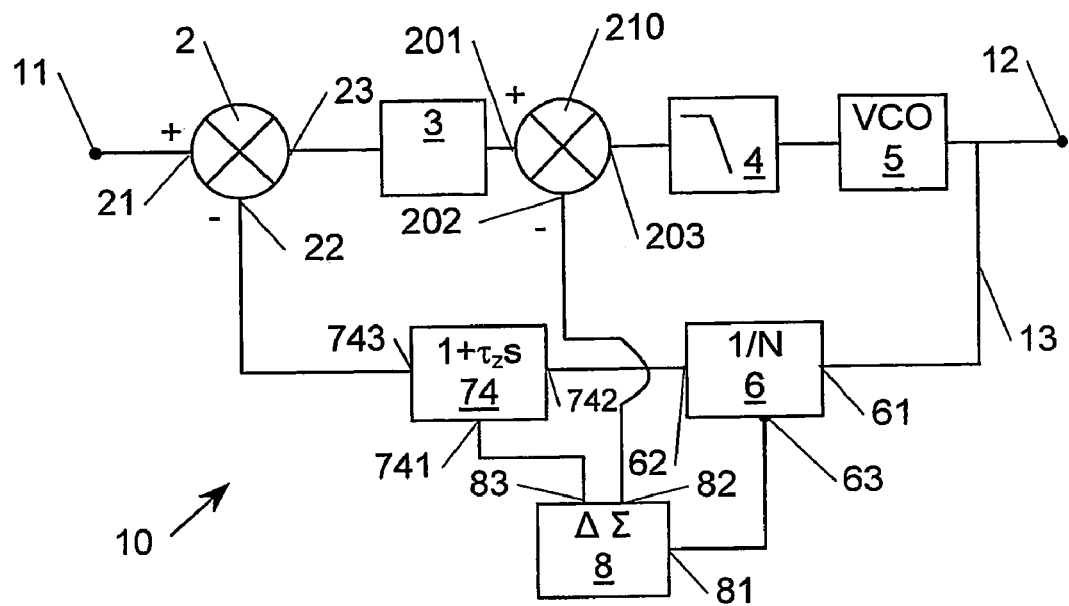
FIG. 7 shows a block diagram of a sixth example of an embodiment of a phase locked loop according to the invention.

Thereby the zero is realised in front of the divider output-signal and not behind this signal. Thus, is is ensured that the zero is located in the feedback path and is a phantom zero indeed. When a delta-sigma controlled divider is used, the zero may likewise be placed between the original output-signal of the divider and the input of the phase-detector. In this case the jitter in the divider may be compensated by an equal amount of jitter in the zero. This compensation-signal can be derived from the circuitry that is controlling the fractional divider. In FIG. 7 an example of a PLL with such compensation is shown.

FIG. 7 shows a PLL with a delta-sigma driven frequency divider 6. A control input 63 of the frequency divider 6 is connected to a delta-sigma modulator 8. The delta-sigma modulator 8 is also connected to a second combiner device 210 and a first input 741 of a zero device 74. The zero device 74 is connected with a second input 742 to the output of the frequency divider 6. The output of the zero device 74 is connected to a second input 22 of a first combiner 2. The second combiner device 210 is connected with a first input 201 to the output of the phase detector 3. The output 203 of the second combiner device 210 is connected to the filter section 4.

Figure 8:
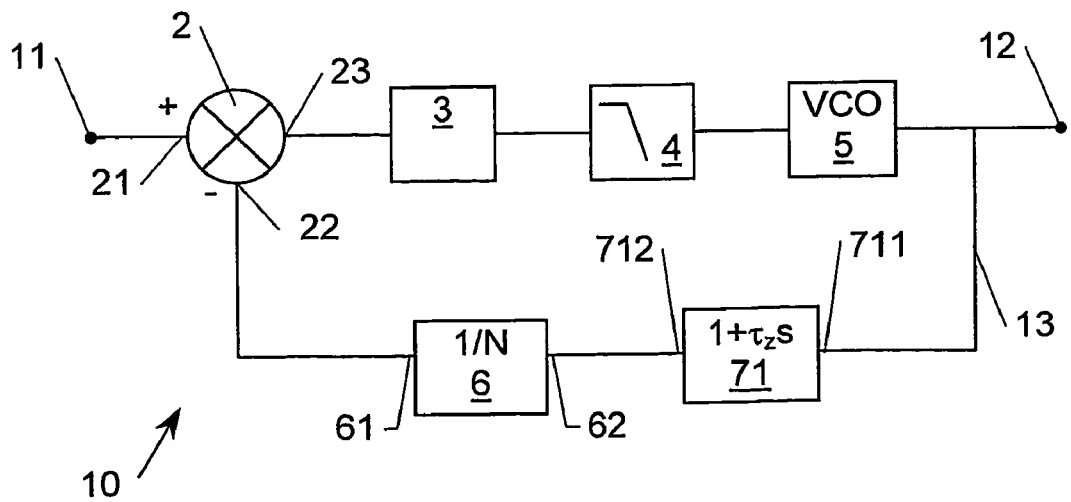
FIG. 8 shows a block diagram of a seventh example of an embodiment of a phase locked loop according to the invention.
Figure 9:
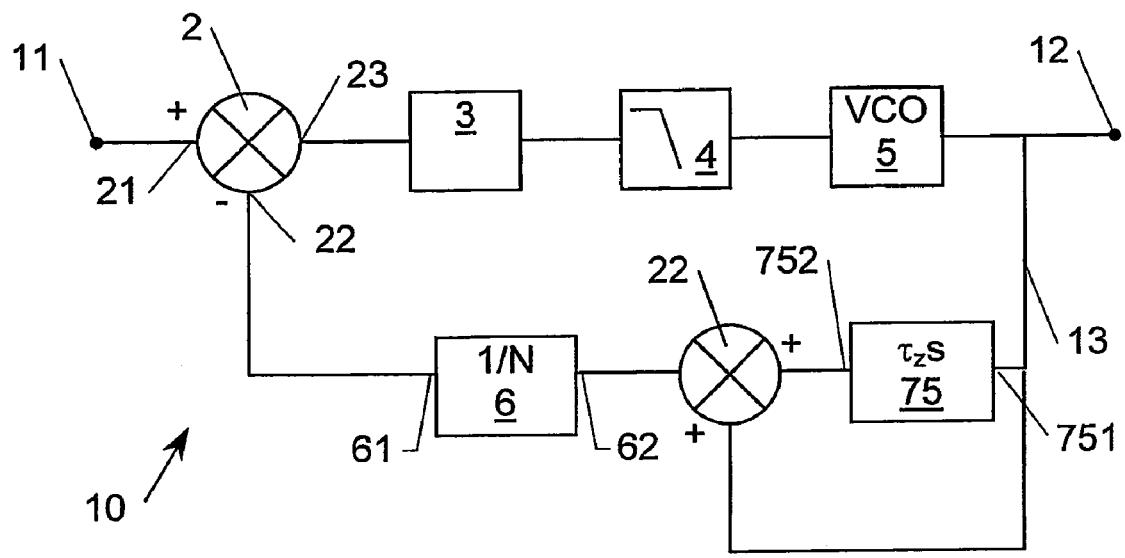
FIG. 9 shows a block diagram of a eighth example of an embodiment of a phase locked loop according to the invention.

In the example of a PLL according to the invention of FIG. 8, the zero device 71 is implemented between the frequency divider 61 and the VCO 5. An input 711 of the zero device is connected to the output of the VCO and an output 712 of the zero device is connected to the input 62 of the frequency divider 6. The zero device 7 has a transfer function equal to $1+\tau_z s$. In FIG. 8, the zero device is implemented as a single device with said transfer function. As an alternative as is shown in FIG. 9, the required transfer function may be obtained by a device 75 with a transfer equal to $\tau_z s$ connected with the input 752 and output 751 to the inputs of a combiner device 22.

Figure 10:
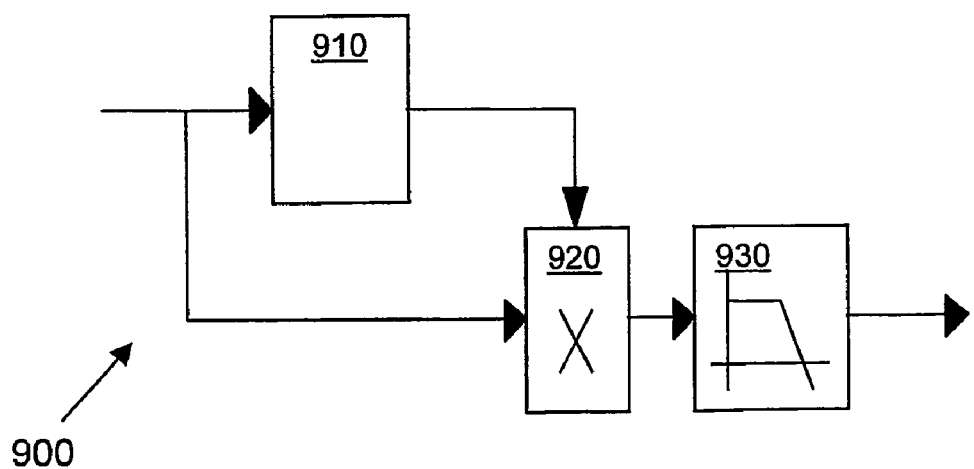
FIGS. 10 and 11 show circuit diagrams of frequency discriminators which may be used to provide zeros in a phase locked loop according to the invention.

A PLL according to the invention may be implemented with analog devices and/or digital devices and/or software. Likewise, the zero in the feedback loop may be implemented either in the analog domain and/or in the digital-domain and/or software. The zero may be implemented in any appropriate manner. The zero may for instance be implemented as a frequency discriminator. An example of such a frequency discriminator device 900 is shown in FIG. 10. The discriminator comprises a delay-device 910, a multiplier-element 920 and a low-pass filter 930. The delay device is connected with both the input and the output to the inputs of the multiplier. An output of the multiplier is connected to the input of the filter 930. When the delay of the delay device 910 is correctly chosen ($\omega_o \tau = \pi/2 + n\pi$ and simultaneously $\tau = \tau_z$), the output-signal is proportional to small frequency-deviations relative to $\omega_o$. The low-pass filter 930 may be combined with a filter already present in the PLL.

Figure 11:
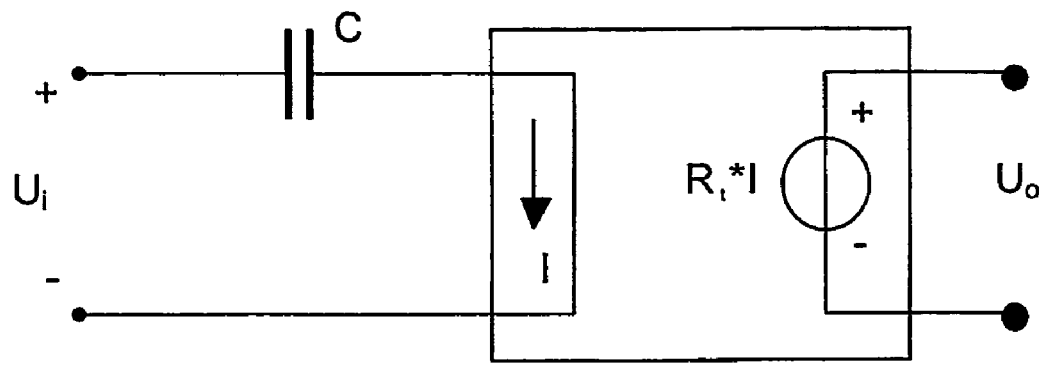

Another example of a frequency discriminator is shown in FIG. 11. The frequency discriminator of FIG. 11 comprises a capacitor connected between the positive and negative contacts of an input $u_i$ of the discriminator. Connected to the capacitor is an amplifier device $R_rI$ which provides a signal which is proportional to the current between the input contacts. For example, supposing the input signal is equal to $A*\cos(\phi(t))$, the capacitor has a capacitance C and the amplifier an amplification $R_r$, the output signal of the discriminator of FIG. 11 is equal to $R_r*C*A*\sin(\phi t)*d(\phi(t))/dt$, The zero may also be implemented in a different way, for example using a different frequency discriminator, such as the all digital frequency discriminator known from Beards at al., "An oversampling Delta-sigma frequency dscriminator", *IEEE Transactions on Circuits and Systems-II: Analog and digital signal processing*" vol. 41, no. 1, January 1994, pp. 26-32.

A PLL or synthesiser according to the invention may be used in a (portable-) communication device, in order to generate one or more periodic signals. The PLL may for example be required to translate a received radio-signal to a lower frequency or to translate a signal to be transmitted to the desired radio frequency. In such application it is often required that the synthesizer or PLL can be switched as quickly as possible. Especially in fast frequency hopping systems, such as systems operating in accordance with the Bluetooth protocol, the settling-time of the PLL is a major issue. Hence, a PLL according to the invention is especially suited for use in such systems.

The invention claimed is:

1. A phase locked loop (PLL) circuit comprising:
a loop input;
a phase detector section for detecting a phase difference between an input signal and a reference signal, said phase detector section having a detector input connected to said loop input, a reference input and a detector output for outputting a signal related to said phase difference;
a controlled oscillator having an input communicatively connected to said detector output and an oscillator output connected to a loop output; and
a feedback circuit connecting said oscillator output to said reference input, wherein said feedback circuit includes a device having a transfer function with at least one zero, and the phase locked loop circuit has a closed loop transfer function without zeros and wherein said feedback circuit further includes at least one frequency divider device and wherein said feedback circuit includes a first frequency divider device and a second frequency divider device, said second frequency divider device having a transfer function with a zero; and
wherein an output of the second frequency divider device is connected to an first input of a second combiner device, a second input of the second combiner device is connected to the output of the phase detector, an output of the second combiner device is communicatively connected to the VCO, and wherein:
the second divider device comprises a phase detector section and has a transfer function with said zero.

2. A phase locked loop (PLL) circuit comprising:
a loop input;
a phase detector section for detecting a phase difference between an input signal and a reference signal, said phase detector section having a detector input connected to said loop input, a reference input and a detector output for outputting a signal related to said phase difference;
a controlled oscillator having an input communicatively connected to said detector output and an oscillator output connected to a loop output; and
a feedback circuit connecting said oscillator output to said reference input, wherein said feedback circuit includes a device having a transfer function with at least one zero, and the phase locked loop circuit has a closed loop transfer function without zeros and wherein said feedback circuit further includes at least one frequency divider device and wherein said frequency divider device is connected to a delta-sigma modulator device; and
wherein said device having a transfer function with a zero has a first input connected to said delta-sigma modulator and a second input connected to the output of the frequency divider.

3. A phase locked loop (PLL) circuit comprising:
a loop input;
a phase detector section for detecting a phase difference between an input signal and a reference signal, said phase detector section having a detector input connected to said loop input, a reference input and a detector output for outputting a signal related to said phase difference;
a controlled oscillator having an input communicatively connected to said detector output and an oscillator output connected to a loop output; and
a feedback circuit connecting said oscillator output to said reference input,
wherein said feedback circuit includes a device having a transfer function with at least one zero, and the phase locked loop circuit has a closed loop transfer function without zeros, and wherein said feedback circuit further includes at least one frequency divider device; and wherein said frequency divider device is connected in series with a device having a transfer function with a zero, and wherein said device having a transfer function with a zero has an input connected to the controlled oscillator and an output connected to an input of the frequency divider; and
wherein said device having a transfer function with a zero comprises:
a device with a transfer function equal to $\tau_s s$, said device with a transfer function equal to $\tau_s s$ with a device input connected to the output of the oscillator;
a combiner device with:
a first combiner input connected to the output of the device with a transfer function equal to $\tau_s s$;
a second combiner input connected to the input of the device with a transfer function equal to $\tau_s s$, and
a combiner output connected to the input of the frequency divider device.

* * * * *

UNITED STATES PATENT AND TRADEMARK OFFICE
CERTIFICATE OF CORRECTION

PATENT NO. : 7,391,840 B2
APPLICATION NO. : 10/517181
DATED : June 24, 2008
INVENTOR(S) : Eikenbroek It is certified that error appears in the above-identified patent and that said Letters Patent is hereby corrected as shown below:

In Column 4, Line 16, in Equation (4), delete "$H_{closed} = \dfrac{K_D H_f(s) \dfrac{K_o}{s}}{1 + \left[\dfrac{1+\tau_z s}{N}\right] K_D H_f(s) \dfrac{K_o}{s}}$"

and insert -- $H_{closed} = \dfrac{K_D H_f(s) \dfrac{K_o}{s}}{1 + \left[\dfrac{1+\tau_z s}{N}\right] K_D H_f(s) \dfrac{K_o}{s}}$ --, therefor.

Signed and Sealed this

Thirteenth Day of January, 2009

JON W. DUDAS
*Director of the United States Patent and Trademark Office*